United States Patent
Kaji et al.

(10) Patent No.: US 10,382,090 B2
(45) Date of Patent: Aug. 13, 2019

(54) SPREAD SPECTRUM CLOCK GENERATOR, PATTERN GENERATOR, SPREAD SPECTRUM CLOCK GENERATION METHOD, AND PATTERN GENERATION METHOD

(71) Applicant: ANRITSU CORPORATION, Kanagawa (JP)

(72) Inventors: Ittetsu Kaji, Kanagawa (JP); Kazuhiro Yamane, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 15/921,112

(22) Filed: Mar. 14, 2018

(65) Prior Publication Data

US 2018/0269924 A1    Sep. 20, 2018

(30) Foreign Application Priority Data

Mar. 17, 2017  (JP) ................................ 2017-053051

(51) Int. Cl.
*H04B 1/7087* (2011.01)
*H04B 15/04* (2006.01)
*H04L 7/033* (2006.01)

(52) U.S. Cl.
CPC .......... *H04B 1/7087* (2013.01); *H04B 15/04* (2013.01); *H04B 2201/7073* (2013.01); *H04B 2201/70728* (2013.01); *H04L 7/0331* (2013.01)

(58) Field of Classification Search
CPC .......... H04B 1/7087; H04B 2201/7073; H04B 2201/70728; H04B 15/04; H04L 7/0331
See application file for complete search history.

(56) References Cited

U.S. PATENT DOCUMENTS

| | | | |
|---|---|---|---|
| 2008/0276113 A1* | 11/2008 | Tabeta ...................... | G06F 1/08 713/500 |
| 2009/0160493 A1* | 6/2009 | You ........................ | H04B 15/02 327/105 |
| 2011/0285439 A1* | 11/2011 | Xiu .......................... | G06F 1/025 327/159 |
| 2012/0163417 A1* | 6/2012 | Mori ........................ | H04K 3/42 375/135 |
| 2014/0059384 A1* | 2/2014 | Tran ................... | G01R 31/3171 714/32 |

FOREIGN PATENT DOCUMENTS

JP        2007-274474 A     10/2007

* cited by examiner

*Primary Examiner* — Syed Haider
(74) *Attorney, Agent, or Firm* — Pearne & Gordon LLP

(57) ABSTRACT

Provided is a technique that can generate a spread spectrum clock signal in all of an upper-spread mode, a down-spread mode, and a center-spread mode. A spread spectrum clock generator (2) spreads a spectrum of a signal with a predetermined carrier frequency to generate a spread spectrum clock signal under the control of a control unit (13). The control unit includes carrier frequency correction control means (13b). The carrier frequency correction control means shifts the predetermined carrier frequency to generate, from one spread mode, a spread spectrum clock signal of another pseudo spread mode.

12 Claims, 10 Drawing Sheets

SPREAD SPECTRUM CLOCK GENERATOR, PATTERN GENERATOR, SPREAD SPECTRUM CLOCK GENERATION METHOD, AND PATTERN GENERATION METHOD

TECHNICAL FIELD

The present invention relates to a spread spectrum clock generator and a spread spectrum clock generation method that spread a spectrum of a reference clock signal to generate a spread spectrum clock signal and a pattern generator and a pattern generation method that generate a desired pattern signal using the spread spectrum clock signal and data.

BACKGROUND ART

In recent years, a standard using a spread spectrum clock (SSC) which spreads the spectrum of a reference clock signal to generate a spread spectrum clock signal has come into widespread use as measures for electro-magnetic compatibility (ENC) in, for example, a bus of a computer. For example, a down-spread mode is used as the spread mode in Universal Serial Bus (USE) 3.0 which is one of the serial bus standards for connecting a peripheral device to an information device such as a computer. In addition, for example, in PCI Express 3.0 (Gen3) which is an I/O serial interface, a center-spread mode is used as the spread mode.

However, there is no standard that uses an upper-spread mode as the spread mode. The reason is as follows. In the down-spread mode and the center-spread mode, an average bit rate does not exceed a standard value. However, in the upper-spread mode, peak and average bit rates are high and the operation margin of a device is reduced. In order to solve the problem, the device needs to be configured so as to correspond to a high bit rate and the operation margin of the device needs to increase. However, in this case, there is a disadvantage that a high technique is required or costs increase. For this reason, the upper-spread mode is hardly used.

However, in recent years, various types of digital communication devices have required high transmission capability, with an increase in the number of users or the spreading of multimedia communication. A bit error rate (hereinafter, simply referred to as an error rate) that is defined as the comparison between the number of times a code error occurs in received data and the total amount of received data has been known as one of the indexes for evaluating the quality of digital signals in these digital communication devices.

In a case in which a desired digital communication device is used as an object to be measured and the error rate of the object to be measured is measured, for example, a bit error rate measurement device disclosed in the following Patent Document 1 is used. In this type of bit error rate measurement device, in order to measure the allowable electrical stress range of the object be measured, a pattern generator applies an electrical stress signal with a known pattern as a test signal, the test signal is looped back inside or outside the object to be measured, and the loop-back signal is compared with the test signal received by the error detector to perform jitter tolerance measurement for measuring whether an error occurs according to the amount of stress applied.

However, in this type of bit error rate measurement device, in a case in which a margin test is performed for the object to be measured, a spread spectrum clock signal or a data signal needs to be generated and input to the object to be measured. Therefore, a pattern generator or a spread spectrum clock generator that can generate a spread spectrum clock signal in all of the upper-spread mode, the down-spread mode, and the center-spread mode is required.

RELATED ART DOCUMENT

Patent Document

[Patent Document 1] JP-A-2007-274474

DISCLOSURE OF THE INVENTION

Problem that the Invention is to Solve

However, a one-chip phase locked loop (PLL) IC for generating a spread spectrum clock signal which is currently available in the market hardly requires the upper-spread mode. Therefore, there is a disadvantage that it is very difficult to acquire a one-chip PLL IC corresponding to the upper-spread mode, which results in an increase in costs. As a result, there is a problem that it is difficult to easily generate a spread spectrum clock signal in the upper-spread mode required for a measurement device, such as the above-mentioned bit error rate measurement device, using a commercial one-chip PLL IC. Therefore, it is difficult to generate a spread spectrum clock signal in all of the upper-spread mode, the down-spread mode, and the center-spread mode and it is difficult to satisfy the requirements of the spread spectrum clock generator or the pattern generator.

Accordingly, the invention has been made in view of the above-mentioned problems and an object of the invention is to provide a spread spectrum clock generator and a spread spectrum clock generation method that can generate a spread spectrum clock signal in all of an upper-spread mode, a down-spread mode, and a center-spread mode and a pattern generator and a pattern generation method that can generate a pattern signal using the generated spread spectrum clock signal.

Means for Solving the Problem

In order to achieve the object, according to a first aspect of the invention, there is provided a spread spectrum clock generator that spreads a spectrum of a signal with a predetermined carrier frequency to generate a spread spectrum clock (SSC) signal under the control of a control unit in order to generate a spread spectrum clock defined by a communication standard in a desired spread mode. The control unit includes carrier frequency correction control means. The carrier frequency correction control means shifts the predetermined carrier frequency to generate, from one spread mode, a spread spectrum clock signal of another pseudo spread mode.

According to a second aspect of the invention, in the spread spectrum clock generator according to the first aspect, the desired spread mode may be any one of a down-spread mode, a center-spread mode, and an upper-spread mode. The carrier frequency correction control means may perform at least one of a first control process of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control process of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode.

According to a third aspect, in the spread spectrum clock generator according to the second aspect, the control unit may include modulation factor correction control means. In a case in which the spread spectrum clock signal of the pseudo center-spread mode is generated from the down-spread mode, when a carrier frequency and a modulation factor of the pseudo center-spread mode are Fcenter and SSCcenter, respectively, and a carrier frequency and a modulation factor of the down-spread mode are Fdown and SSCdown, respectively, the modulation factor correction control means may shift the carrier frequency of the down-spread mode, using a calculation expression Fdown=Fcenter×(1+SSCcenter), and may correct the modulation factor of the down-spread mode, using a calculation expression SSCdown=2×SSCcenter/(1+SSCcenter).

According to a fourth aspect, in the spread spectrum clock generator according to the second aspect, the control unit may include modulation factor correction control means. In a case in which the spread spectrum clock signal of the pseudo upper-spread mode is generated from the down-spread mode, when a carrier frequency and a modulation factor of the pseudo upper-spread mode are Fup and SSCup, respectively, and a carrier frequency and a modulation factor of the down-spread mode are Fdown and SSCdown, respectively, the modulation factor correction control means may shift the carrier frequency of the down-spread mode, using a calculation expression Fdown=Fup×(1+SSCup), and may correct the modulation factor of the down-spread mode, using a calculation expression SSCdown=SSCup/(1+SSCup).

According to a fifth aspect, in the spread spectrum clock generator according to the second aspect, the control unit may include modulation factor correction control means. In a case in which the spread spectrum clock signal of the pseudo upper-spread mode is generated from the center-spread mode, when a carrier frequency and a modulation factor of the pseudo upper-spread mode are Fup and SSCup, respectively, and a carrier frequency and a modulation factor of the center-spread mode are Fcenter and SSCcenter, respectively, the modulation factor correction control means may shift the carrier frequency of the center-spread mode, using a calculation expression Fcenter=Fup×(1+(SSCup/2)), and may correct the modulation factor of the center-spread mode, using a calculation expression SSCcenter=SSCup/(2+SSCup).

According to a sixth aspect, in the spread spectrum clock generator according to the second aspect, the control unit may include modulation factor correction control means. In a case in which the spread spectrum clock signal of the pseudo down-spread mode is generated from the center-spread mode, when a carrier frequency and a modulation factor of the pseudo down-spread mode are Fdown and SSCdown, respectively, and a carrier frequency and a modulation factor of the center-spread mode are Fcenter and SSCcenter, respectively, the modulation factor correction control means may shift the carrier frequency of the center-spread mode, using a calculation expression Fcenter=Fdown×(1−(SSCdown/2)), and may correct the modulation factor of the center-spread mode, using a calculation expression SSCcenter=SSCdown/(2−SSCdown).

According to a seventh aspect, in the spread spectrum clock generator according to the second aspect, the control unit may include modulation factor correction control means. In a case in which the spread spectrum clock signal of the pseudo down-spread mode is generated from the upper-spread mode, when a carrier frequency and a modulation factor of the pseudo down-spread mode are Fdown and SSCdown, respectively, and a carrier frequency and a modulation factor of the upper-spread mode are Fup and SSCup, respectively, the modulation factor correction control means may shift the carrier frequency of the upper-spread mode, using a calculation expression Fup=Fdown×(1−SSCdown), and may correct the modulation factor of the upper-spread mode, using a calculation expression SSCup=SSCdown/(1−SSCdown).

According to an eighth aspect, in the spread spectrum clock generator according to the second aspect, the control unit may include modulation factor correction control means. In a case in which the spread spectrum clock signal of the pseudo center-spread mode is generated from the upper-spread mode, when a carrier frequency and a modulation factor of the pseudo center-spread mode are Fcenter and SSCcenter, respectively, and a carrier frequency and a modulation factor of the upper-spread mode are Fup and SSCup, respectively, the modulation factor correction control means may shift the carrier frequency of the upper-spread mode, using a calculation expression Fup=Fcenter×(1−(SSCcenter)), and may correct the modulation factor of the upper-spread mode, using a calculation expression SSCup=2×SSCcenter/(1−SSCcenter).

According to a ninth aspect, there is provided a spread spectrum clock generation method that spreads a spectrum of a signal with a predetermined carrier frequency to generate a spread spectrum clock (SSC) signal in order to generate a spread spectrum clock defined by a communication standard in a desired spread mode. The spread spectrum clock generation method includes shifting the predetermined carrier frequency to generate, from one spread mode, a spread spectrum clock signal of another pseudo spread mode.

According to a tenth aspect, in the spread spectrum clock generation method according to the ninth aspect, the desired spread mode may be any one of a down-spread mode, a center-spread mode, and an upper-spread mode. The spread spectrum clock generation method may further include at least one of a first control step of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control step of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode.

According to an eleventh aspect, the spread spectrum clock generation method according to the tenth aspect may further include: in a case in which the spread spectrum clock signal of the pseudo center-spread mode is generated from the down-spread mode, when a carrier frequency and a modulation factor of the pseudo center-spread mode are Fcenter and SSCcenter, respectively, and a carrier frequency and a modulation factor of the down-spread mode are Fdown and SSCdown, respectively, a step of shifting the carrier frequency of the down-spread mode, using a calculation expression Fdown=Fcenter×(1+SSCcenter), and correcting the modulation factor of the down-spread mode, using a calculation expression SSCdown=2×SSCcenter/(1+SSCcenter).

According to a twelfth aspect, the spread spectrum clock generation method according to the tenth aspect may further include: in a case in which the spread spectrum clock signal of the pseudo upper-spread mode is generated from the down-spread mode, when a carrier frequency and a modulation factor of the pseudo upper-spread mode are Fup and SSCup, respectively, and a carrier frequency and a modulation factor of the down-spread mode are Fdown and SSCdown, respectively, a step of shifting the carrier frequency of the down-spread mode, using a calculation expression Fdown=Fup×(1+SSCup), and correcting the modulation factor of the down-spread mode, using a calculation expression SSCdown=SSCup/(1+SSCup).

According to a thirteenth aspect, the spread spectrum clock generation method according to the tenth aspect may further include: in a case in which the spread spectrum clock signal of the pseudo upper-spread mode is generated from the center-spread mode, when a carrier frequency and a modulation factor of the pseudo upper-spread mode are Fup and SSCup, respectively, and a carrier frequency and a modulation factor of the center-spread mode are Fcenter and SSCcenter, respectively, a step of shifting the carrier frequency of the center-spread mode, using a calculation expression Fcenter=Fup×(1+(SSCup/2)), and correcting the modulation factor of the center-spread mode, using a calculation expression SSCcenter=SSCup/(2+SSCup).

According to a fourteenth aspect, the spread spectrum clock generation method according to the tenth aspect may further include: in a case in which the spread spectrum clock signal of the pseudo down-spread mode is generated from the center-spread mode, when a carrier frequency and a modulation factor of the pseudo down-spread mode are Fdown and SSCdown, respectively, and a carrier frequency and a modulation factor of the center-spread mode are Fcenter and SSCcenter, respectively, a step of shifting the carrier frequency of the center-spread mode, using a calculation expression Fcenter=Fdown×(1−(SSCdown/2)), and correcting the modulation factor of the center-spread mode, using a calculation expression SSCcenter=SSCdown/(2−SSCdown).

According to a fifteenth aspect, the spread spectrum clock generation method according to the tenth aspect may further include: in a case in which the spread spectrum clock signal of the pseudo down-spread mode is generated from the upper-spread mode, when a carrier frequency and a modulation factor of the pseudo down-spread mode are Fdown and SSCdown, respectively, and a carrier frequency and a modulation factor of the upper-spread mode are Fup and SSCup, respectively, a step of shifting the carrier frequency of the upper-spread mode, using a calculation expression Fup=Fdown×(1−SSCdown), and correcting the modulation factor of the upper-spread mode, using a calculation expression SSCup=SSCdown/(1−SSCdown).

According to a sixteenth aspect, the spread spectrum clock generation method according to the tenth aspect may further include: in a case in which the spread spectrum clock signal of the pseudo center-spread mode is generated from the upper-spread mode, when a carrier frequency and a modulation factor of the pseudo center-spread mode are Fcenter and SSCcenter, respectively, and carrier frequency and a modulation factor of the upper-spread mode are Fup and SSCup, respectively, a step of shifting the carrier frequency of the upper-spread mode, using a calculation expression Fup=Fcenter×(1−(SSCcenter)), and correcting the modulation factor of the upper-spread mode, using a calculation expression SSCup=2×SSCcenter/(1−SSCcenter).

According to a seventeenth aspect, there is provided a pattern generator that generates a pattern signal using the spread spectrum clock signal generated by the spread spectrum clock generator according to any one of the first to tenth aspects.

According to an eighteenth aspect, there is provided a pattern generation method including a step of generating a pattern signal using the spread spectrum clock signal generated by the spread spectrum clock generation method according to any one of the ninth to sixteenth aspects.

Advantage of the Invention

According to the invention, the spread spectrum clock signal can be generated by the upper-spread mode that is particularly required for the spread spectrum clock generator or the pattern generator. The spread spectrum clock signal can be generated by all of the upper-spread mode, the down-spread mode, and the center-spread mode. In addition, in a case in which the control process of shifting the carrier frequency and the control process of correcting the modulation factor are performed using predetermined calculation expressions, it is possible to generate a spread spectrum clock signal with high accuracy. In a case in which a margin test is performed for an object to be measured, a pattern signal which has been modulated with the spread spectrum clock signal generated by any one of the upper-spread mode, the down-spread mode, and the center-spread mode can be input as a test signal to the object to be measured to perform the margin test.

BEST MODE FOR CARRYING OUT THE INVENTION

Hereinafter, an embodiment of the invention will be described in detail with reference to the accompanying drawings.

Figure 1:
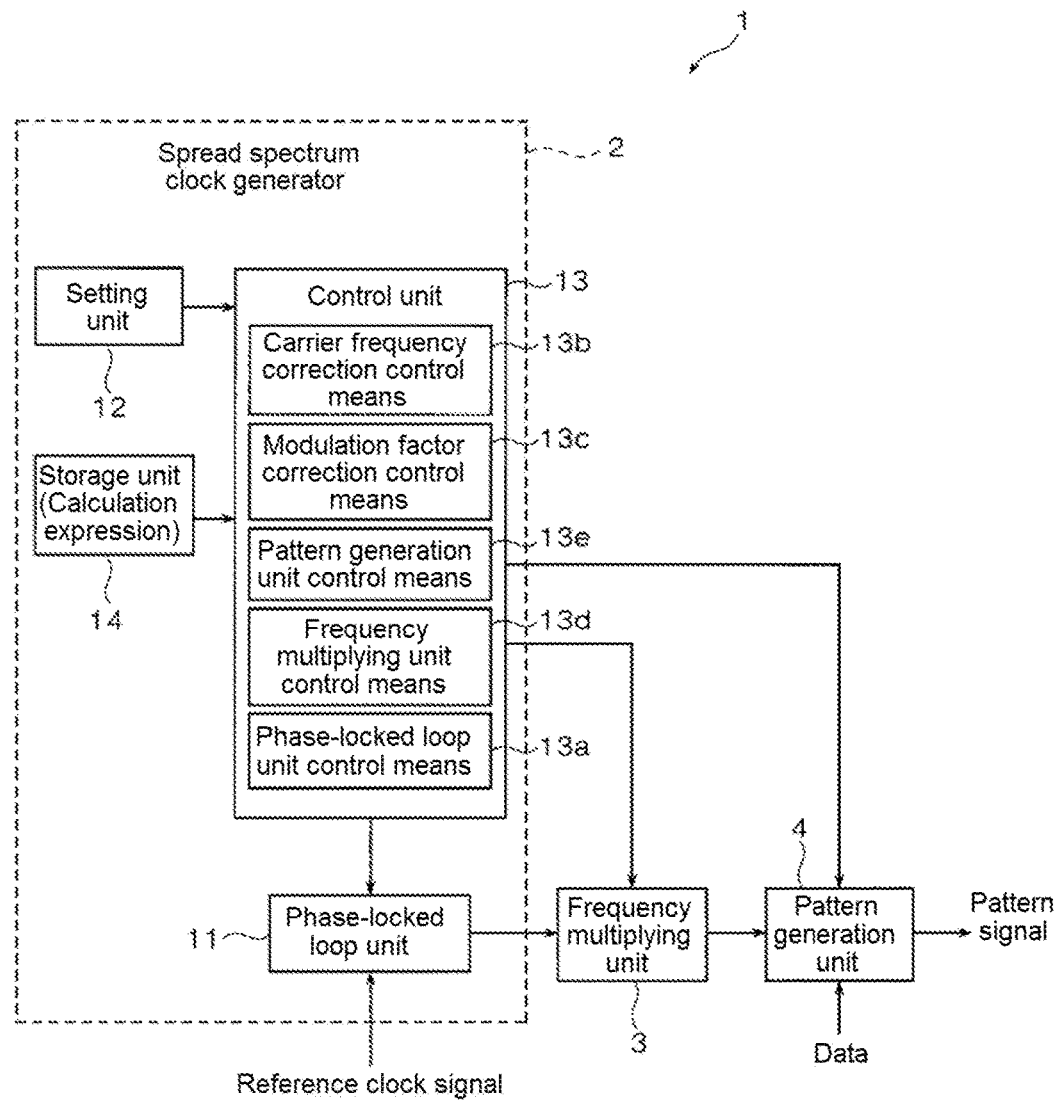
FIG. 1 is a block diagram illustrating a pattern generator including a spread spectrum clock generator according to the invention.

As illustrated in FIG. 1, pattern generator 1 according to this embodiment generates a desired pattern signal, using a spread spectrum clock signal, and has a schematic configuration including a spread spectrum clock generator 2, a frequency multiplying unit 3, and a pattern generation unit 4.

The spread spectrum clock generator 2 spreads the spectrum of a reference clock signal such that the period of the reference clock signal is slightly changed to generate a frequency-modulated spread spectrum clock signal and includes a phase locked loop unit 11, a setting unit 12, a control unit 13, and a storage unit 14.

Figure 2:
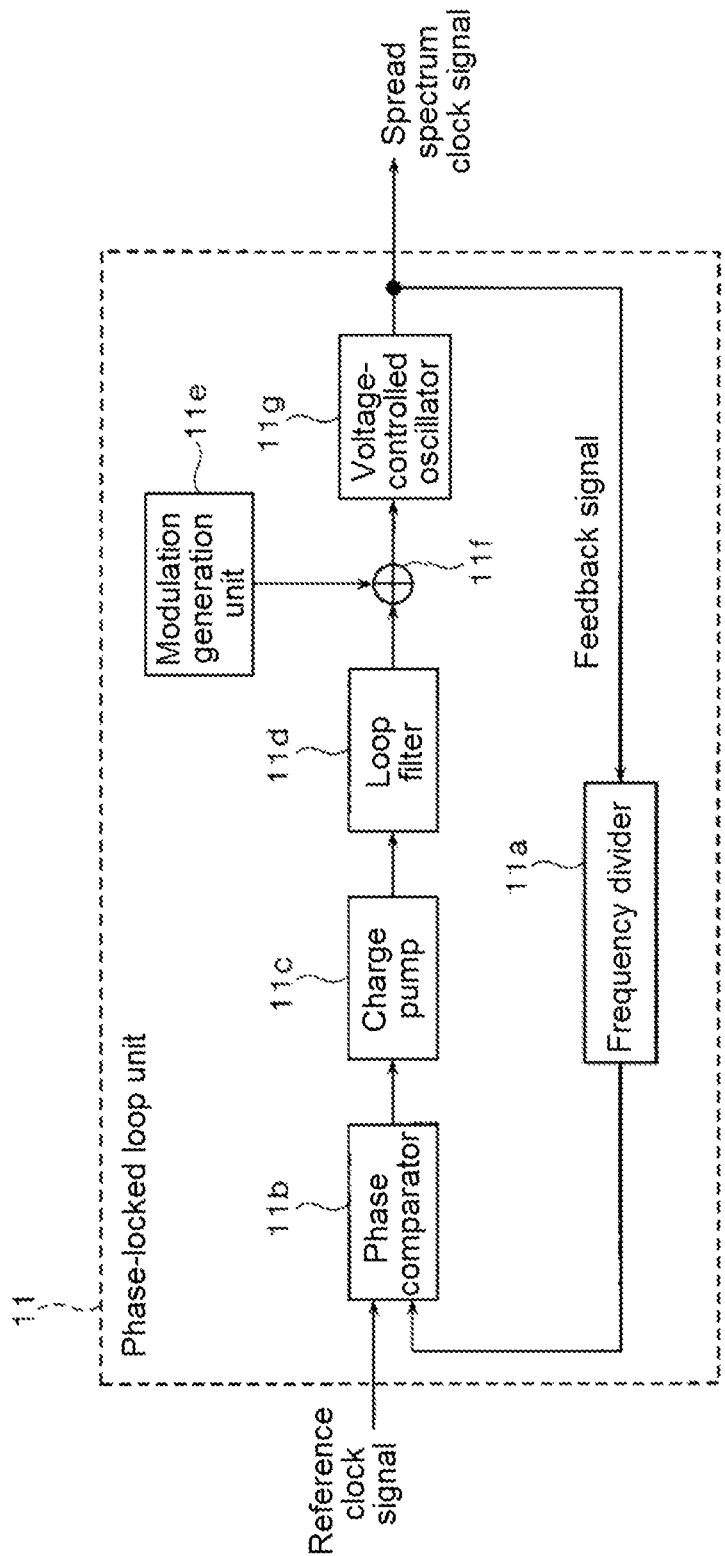
FIG. 2 is a block diagram illustrating an example of a phase locked loop unit illustrated in FIG. 1.

As illustrated in FIG. 2, the phase locked loop unit 11 includes a frequency divider 11a, a phase comparator 11b, a charge pump 11c, a loop filter 11d, a modulation generation unit 11e, an adder 11f, and a voltage-controlled oscillator (VCO) 11g.

The frequency divider 11a sets the center frequency of the spread spectrum clock signal output from the voltage-controlled oscillator 11g such that the center frequency is a multiple of the center frequency of the reference clock signal. The frequency divider 11a divides the frequency of the spread spectrum clock signal output from the voltage-controlled oscillator 11g as a feedback signal and matches the frequency of the frequency-divided feedback signal with the frequency of the reference clock signal.

The phase comparator 11b compares the phase of the reference clock signal with the phase of the feedback signal whose frequency has been divided by the frequency divider 11a and outputs a phase difference signal with a pulse width corresponding to a phase difference.

The charge pump 11c supplies a charge/discharge current to the loop filter 11d according to the phase difference signal input from the phase comparator 11b.

The loop filter 11d converts the current supplied from the charge pump 11c into a voltage and outputs a signal obtained by removing a high-frequency component of the converted voltage to the adder 11f.

The modulation generation unit 11e generates a modulation signal for modulating a frequency and outputs the generated modulation signal to the adder 11f, under the control of the control unit 13 based on a spread mode, a modulation frequency, a carrier frequency, and a modulation factor set by the setting unit 12.

The adder 11f adds the signal input from the loop filter 11d and the modulation signal input from the modulation generation unit 11e and outputs the added signal to the voltage-controlled oscillator 11g.

The voltage-controlled oscillator 11g operates such that an output (spread spectrum clock signal) is fed back to the phase comparator 11b and an input clock and the feedback signal have the same frequency and outputs the spread spectrum clock signal whose frequency spectrum has been spread according to the added signal input from the adder 11f.

The setting unit 12 sets the selection of a spread mode (any one of a down-spread mode, a center-spread mode, an upper-spread mode), a modulation frequency (for example, 33 kHz), a carrier frequency of the selected spread mode, and a modulation factor (the percentage of modulation with respect to the carrier frequency) as setting information required to generate the spread spectrum clock signal subjected to desired spectrum spreading. At the beginning, the spread mode is set to, for example, the center-spread mode.

The control unit 13 controls the overall operation of the phase locked loop unit 11, the frequency multiplying unit 3, and the pattern generation unit 4 on the basis of the setting information set by the setting unit 12 and includes phase locked loop unit control means 13a, carrier frequency correction control means 13b, modulation factor correction control means 13c, frequency multiplying unit control means 13d, and pattern generation unit control means 13e. That is, the phase locked loop unit control means 13a controls the phase locked loop unit 11 (modulation generation unit 11e) such that the spread spectrum clock signal obtained by spreading the spectrum of the reference clock signal according to the selected spread mode (any one of the down-spread mode, the center-spread mode, and the upper-spread mode), the carrier frequency, and the modulation factor is generated.

The carrier frequency correction control means 13b performs a control process of shifting the carrier frequency of the modulation generation unit 11e in the phase locked loop unit 11 in a case in which a spread mode is selected by the setting unit 12 and the spread spectrum clock signal is output or a control process of shifting the carrier frequency of the modulation generation unit 11e in the phase locked loop unit 11 using calculation expressions which will be described below. The modulation factor correction control means 13c performs a control process of correcting the modulation factor of the modulation generation unit 11e in the phase locked loop unit 11 using the calculation expressions which will be described below. However, in a case in which the control process of shifting the carrier frequency is performed, for example, the modulation factor is about 5000 ppm in a 1-ppm step.

The frequency multiplying unit control means 13d controls the frequency multiplying unit 3 such that a spread spectrum clock signal with a frequency that is m (m: a positive integer) times higher than the frequency of the spread spectrum clock signal output from the phase locked loop unit 11 is output.

The pattern generation unit control means 13e controls the pattern generation unit 4 such that a pattern signal with a desired repetitive pattern is generated from the spread spectrum clock signal whose frequency has been multiplied by the frequency multiplying unit 3 and data which is input from the outside.

The storage unit 14 stores calculation expressions (Expressions (1) to (12)) which are used for the control process of shifting the carrier frequency of the modulation generation unit 11e in the phase locked loop unit 11 and the control process of correcting the modulation factor and will be described below.

The frequency multiplying unit 3 outputs a spread spectrum clock signal with a frequency that is m positive integer) times (for example, a frequency that is 20 times) higher than the frequency of the spread spectrum clock signal generated by the spread spectrum clock generator 2 under the control of the control unit 13.

The pattern generation unit 4 receives, as inputs, the spread spectrum clock signal whose frequency has been multiplied by the frequency multiplying unit 3 and data (data of a low-level voltage of "0" and a high-level voltage of "1") input from the outside and generates a pattern signal with a desired repetitive pattern which is obtained by modulating the data with the spread spectrum clock signal, under the control of the control unit 13. For example, in a case in which the pattern generation unit 4 is used as a pattern generator of an error rate measurement device that performs a margin test for an object to be measured, the pattern generation unit 4 generates, as a pattern signal (test signal) with a known pattern to be input to the object to be measured, a pseudo-random bit sequence (PRBS) modulated by the spread spectrum clock signal, a continuous pattern of 0 and 1 as a repetitive signal, and a programmable pattern which is any pattern.

In a case in which the spread spectrum clock generator 2 of the pattern generator 1 having the above-mentioned configuration generates the spread spectrum clock signal in any one of the down-spread mode, the center-spread mode, and the upper-spread mode, first, the setting unit 12 selects a spread mode (any one of the down-spread mode, the center-spread mode, and the upper-spread mode) and sets a modulation frequency, a carrier frequency, and a modulation factor.

Figure 9:
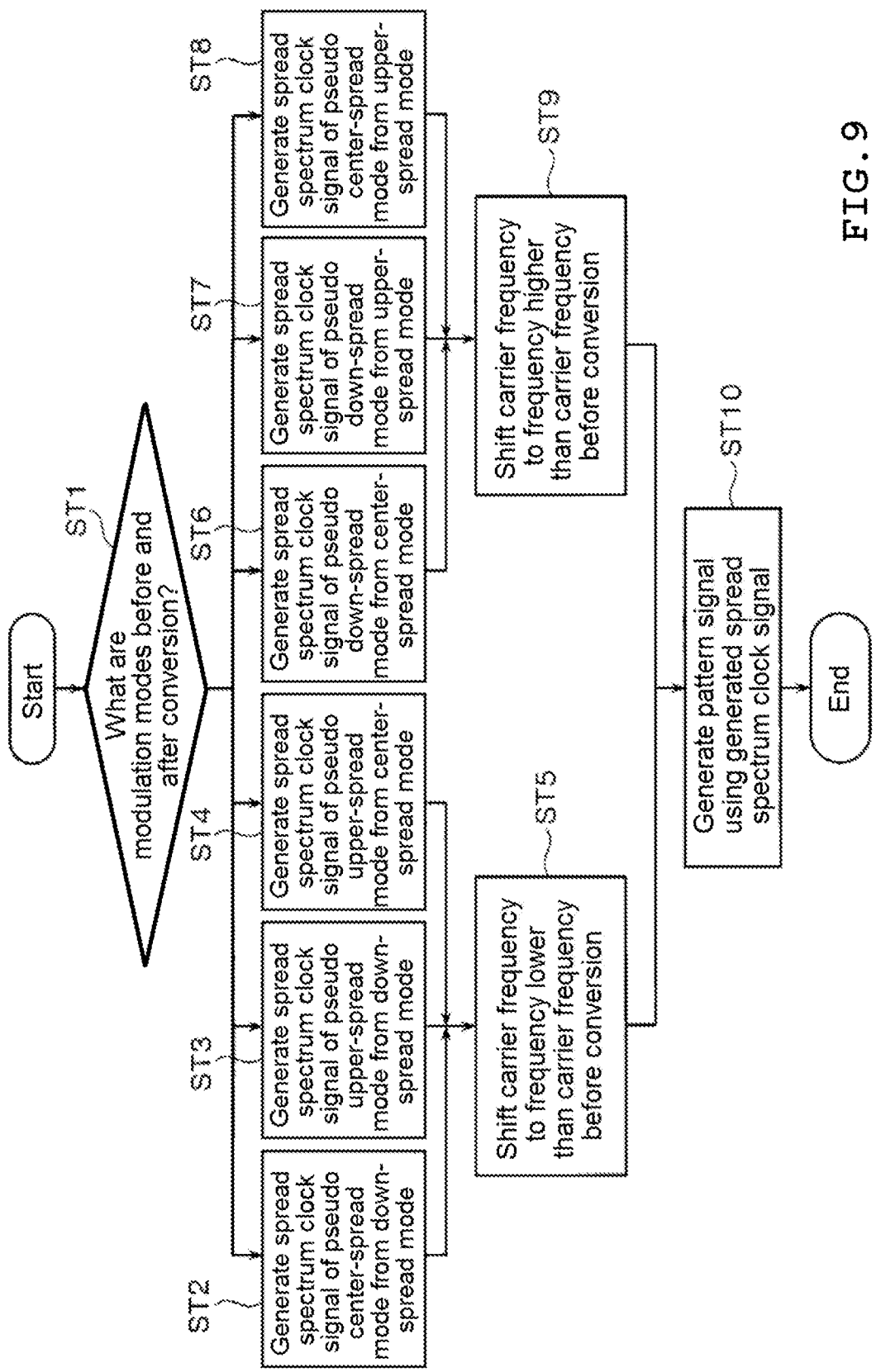
FIG. 9 is a flowchart illustrating a case in which a control process of shifting a carrier frequency is performed in a spread spectrum clock generation method and a pattern generation method according to the invention.

In a case in which the spread mode, the modulation frequency, the carrier frequency, and the modulation factor are set, the control unit 13 performs a control process of shifting the carrier frequency in order to generate, from one spread mode, a spread spectrum clock signal of another pseudo spread mode. That is, as illustrated in FIG. 9, the control unit 13 determines the spread mode (ST1) and performs a first control process of shifting the carrier frequency to a frequency that is lower than the carrier frequency of the original spread mode in any one of a case in which a spread spectrum clock signal of a pseudo center-spread mode is generated from the down-spread mode (ST2), a case in which a spread spectrum clock signal of a pseudo upper-spread mode is generated from the down-spread mode (ST3), and a case in which the spread spectrum clock signal of the pseudo upper-spread mode is generated from the center-spread mode (ST4) (ST5).

In contrast, the control unit 13 performs a second control process of shifting the carrier frequency to a frequency that is higher than the carrier frequency of the original spread mode in any one of a case in which a spread spectrum clock signal of a pseudo down-spread mode is generated from the center-spread mode (ST6), a case in which the spread spectrum clock signal of the pseudo down-spread mode is generated from the upper-spread mode (ST7), and a case in which the spread spectrum clock signal of the pseudo center-spread mode is generated from the upper-spread mode (ST8) (ST9). However, the control process of shifting the carrier frequency can be performed using calculation expressions (Expressions (1), (3), (5), (7), (9), and (11)) which correspond to predetermined spread modes before and after generation and will be described below. In addition, at least one of the first control process (ST5) and the second control process (ST9) may be performed.

Then, the spread spectrum clock signal which has been modulated from one spread mode by another pseudo spread mode is output from the phase locked loop unit 11. Then, the pattern generator 1 generates a pattern signal with a desired repetitive pattern on the basis of the spread spectrum clock signal (frequency-multiplied spread spectrum clock signal) output from the phase locked loop unit 11 and data of a low-level voltage of "0" and a high-level voltage of "1" (ST10).

However, in a case in which the spread spectrum clock signal of the upper-spread mode is generated by the down-spread mode or the center-spread mode, the spread spectrum clock signal of the upper-spread mode can be generated by the control process of shifting the carrier frequency to a frequency that is lower than the carrier frequency of the original spread mode before generation as described above. However, in a case in which the carrier frequency is changed, there is a problem that the modulation factor is also changed with the change in the carrier frequency. In particular, in a case in which a change in the carrier frequency before and after generation is large, there is a problem that the modulation factor in spectrum spreading increases. Specifically, the modulation factor is simply represented by the carrier frequency×frequency shift. Therefore, in a case in which a change in the carrier frequency is large, the modulation factor increases excessively. In a case in which the frequency accuracy of the error rate measurement device is ±1 ppm, for example, when the spread spectrum clock signal is generated with a modulation factor of 0.006 (6000 ppm) by the upper-spread mode and a frequency shift of 9 ppm occurs, there is a problem that the frequency accuracy of the internal clock is reduced by ±1 ppm.

Figure 10:
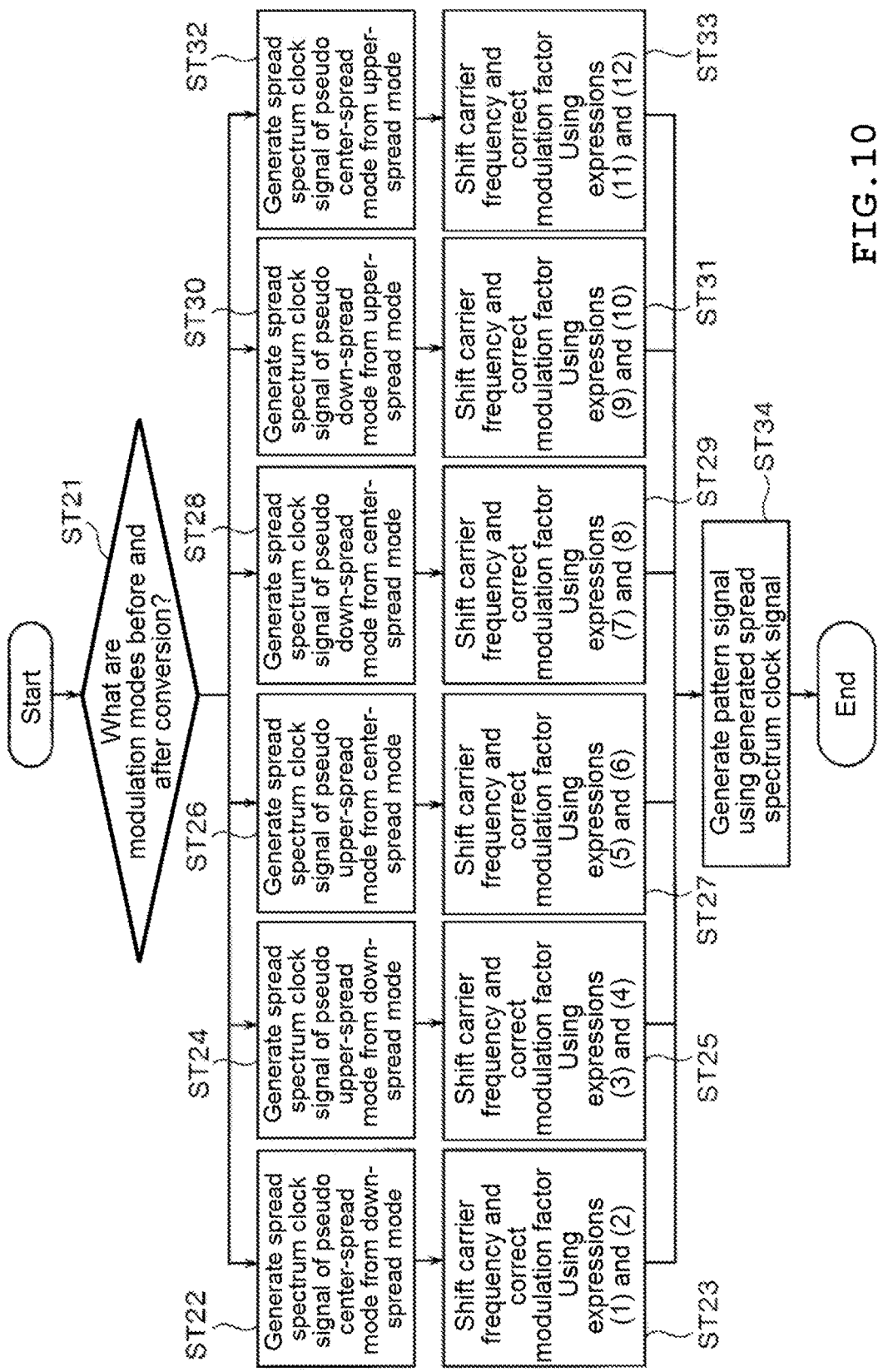
FIG. 10 is a flowchart illustrating a case in which a control process of correcting the carrier frequency and a modulation factor is performed in the spread spectrum clock generation method and the pattern generation method according to the invention.

For this reason, in this embodiment, the problem which occurs in a case in which the change in the carrier frequency is large is solved and the spread spectrum clock signal is generated by any one of the down-spread mode, the center-spread mode, and the upper-spread mode. Therefore, as illustrated in FIG. 10, the spread modes before and after generation are determined (ST21) and the control unit 13 performs the control process of shifting the carrier frequency of the modulation generation unit 11e in the phase locked loop unit 11 of the spread spectrum clock generator 2 and the control process of correcting the modulation factor, using the following calculation expressions.

Figure 3A:
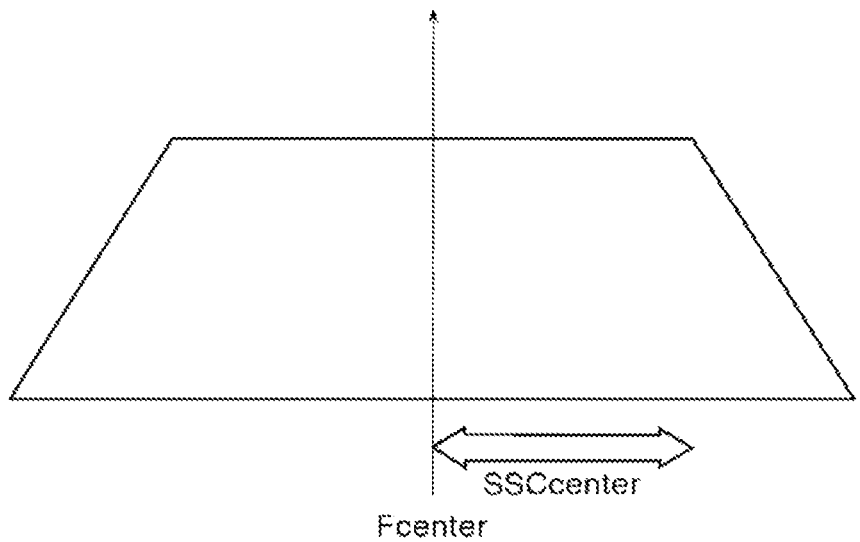
FIGS. 3A and 3B are diagrams illustrating a case in which a spread spectrum clock signal of a pseudo center-spread mode is generated from a down-spread mode.
Figure 3B:
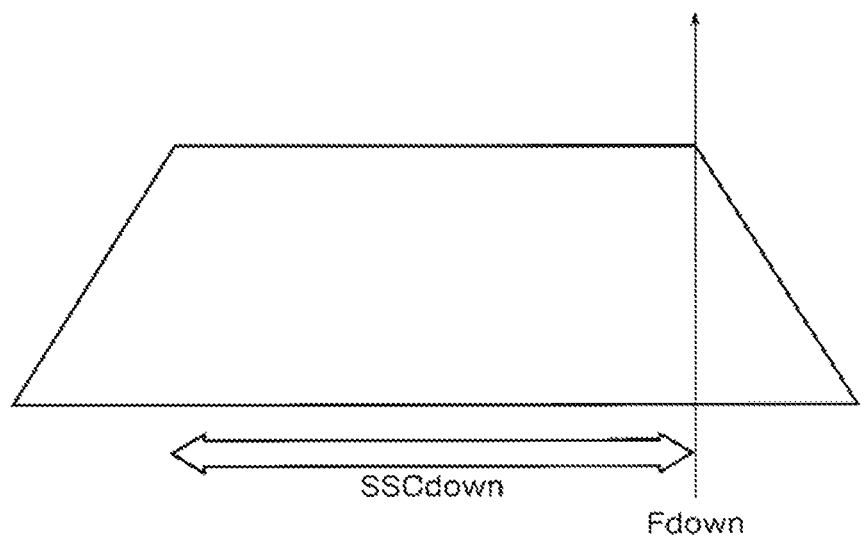

(1) A case in which the spread spectrum clock signal of the pseudo center-spread mode illustrated in FIG. 3A is generated from the down-spread mode illustrated in FIG. 3B (ST22)

In a case in which the carrier frequency and the modulation factor of the down-spread mode are Fdown and SSCdown, respectively, and the carrier frequency and the modulation factor of the center-spread mode are Fcenter and SSCcenter, respectively, it is possible to derive the following Expressions (1) and (2). However, the following Expressions (1) and (2) may be stored in the storage unit 14 in advance.

$$F\text{down} = F\text{center} \times (1 + SSC\text{center}) \quad \text{Expression (1)}$$

$$SSC\text{down} = 2 \times SSC\text{center}/(1 + SSC\text{center}) \quad \text{Expression (2)}$$

The control unit 13 of the spread spectrum clock generator 2 performs a control process of shifting the carrier frequency of the modulation generation unit 11e such that the carrier frequency becomes the carrier frequency Fdown obtained from the above-mentioned Expression (1) and performs a control process of correcting the modulation factor of the modulation generation unit 11e such that the modulation factor becomes the modulation factor SSCdown obtained from Expression (2) (ST23). Therefore, the spread spectrum clock signal of the center-spread mode whose spectrum has been spread with an accurate modulation factor can be generated by the down-spread mode.

Figure 4A:
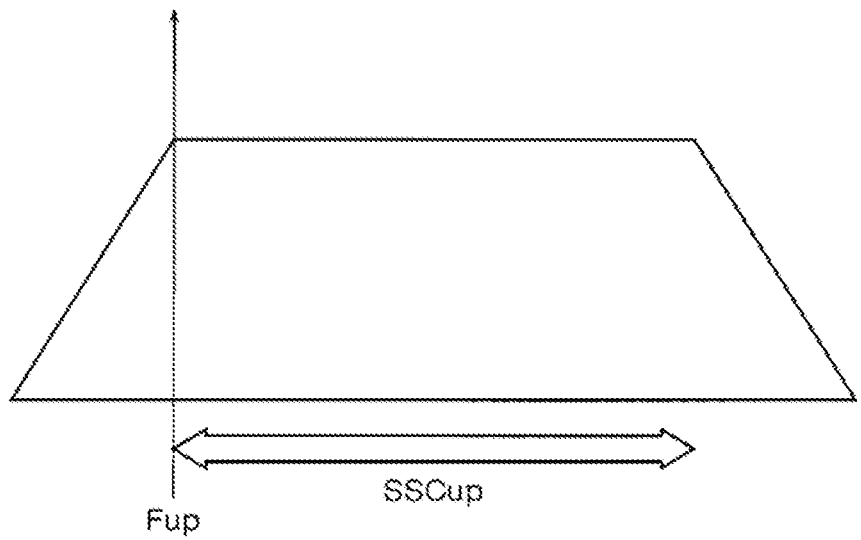
FIGS. 4A and 4B are diagrams illustrating a case in which a spread spectrum clock signal of a pseudo upper-spread mode is generated from a center-spread mode.
Figure 4B:
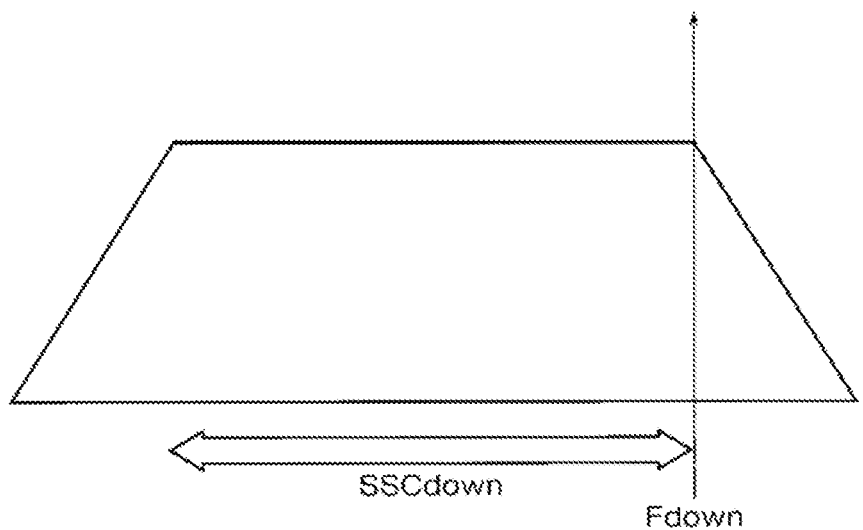

(2) A case in which the spread spectrum clock signal of the pseudo upper-spread mode illustrated in FIG. 4A is generated from the down-spread mode illustrated in FIG. 4B (ST24)

In a case in which the carrier frequency and the modulation factor of the down-spread mode are Fdown and SSCdown, respectively, and the carrier frequency and the modulation factor of the upper-spread mode are Fup and SSCup, respectively, it is possible to derive the following Expressions (3) and (4). However, the following Expressions (3) and (4) may be stored in the storage unit 14 in advance.

$$F\text{down}=F\text{up}\times(1+SSC\text{up}) \qquad \text{Expression (3)}$$

$$SSC\text{down}=SSC\text{up}/(1+SSC\text{up}) \qquad \text{Expression (4)}$$

The control unit 13 of the spread spectrum clock generator 2 performs a control process of shifting the carrier frequency of the modulation generation unit 11e such that the carrier frequency becomes the carrier frequency Fdown obtained from the above-mentioned Expression (3) and performs a control process of correcting the modulation factor of the modulation generation unit 11e such that the modulation factor becomes the modulation factor SSCdown obtained from Expression (4) (S725). Therefore, the spread spectrum clock signal of the upper-spread mode whose spectrum has been spread with an accurate modulation factor can be generated by the down-spread mode.

Figure 5A:
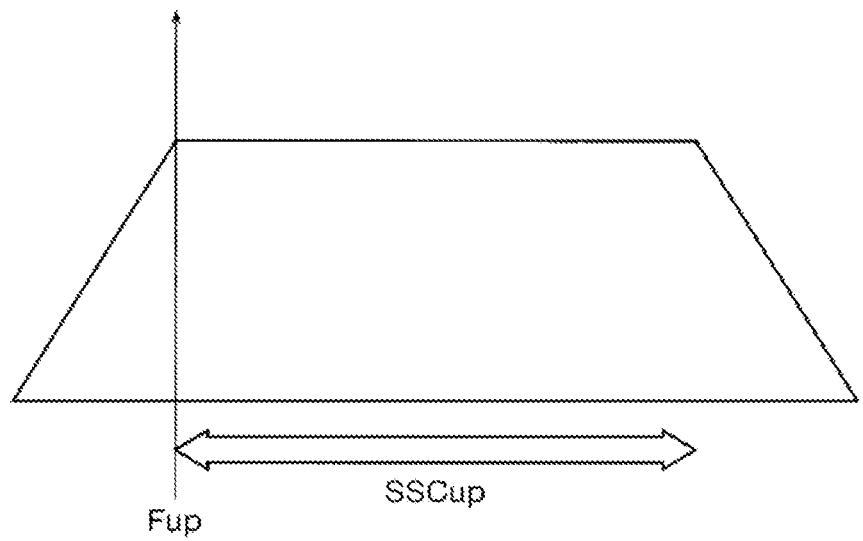
FIGS. 5A and 5B are diagrams illustrating a case in which the spread spectrum clock signal of the pseudo upper-spread mode is generated from the center-spread mode.
Figure 5B:
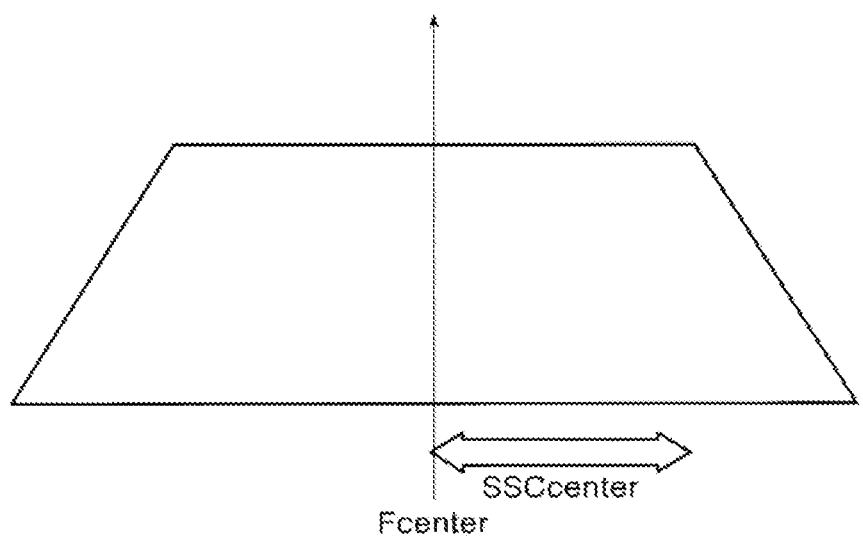

(3) A case in which the spread spectrum clock signal of the pseudo upper-spread mode illustrated in FIG. 5A is generated from the center-spread mode illustrated in FIG. 5B (ST26)

In a case in which the carrier frequency and the modulation factor of the center-spread mode are Fcenter and SSCcenter, respectively, and the carrier frequency and the modulation factor of the upper-spread mode are Fup and SSCup, respectively, it is possible to derive the following Expressions (5) and (6). However, the following Expressions (5) and (6) may be stored in the storage unit 14 in advance.

$$F\text{center}=F\text{up}\times(1+SSC\text{up}/2)) \qquad \text{Expression (5)}$$

$$SSC\text{center}=SSC\text{up}/(2+SSC\text{up}) \qquad \text{Expression (6)}$$

The control unit 13 of the spread spectrum clock generator 2 performs a control process of shifting the carrier frequency of the modulation generation unit 11e such that the carrier frequency becomes the carrier frequency Fcenter obtained from the above-mentioned Expression (5) and performs a control process of correcting the modulation factor of the modulation generation unit 11e such that the modulation factor becomes the modulation factor SSCcenter obtained from Expression (6) (ST27). Therefore, the spread spectrum clock signal of the upper-spread mode whose spectrum has been spread with an accurate modulation factor can be generated by the center-spread mode.

Figure 6A:
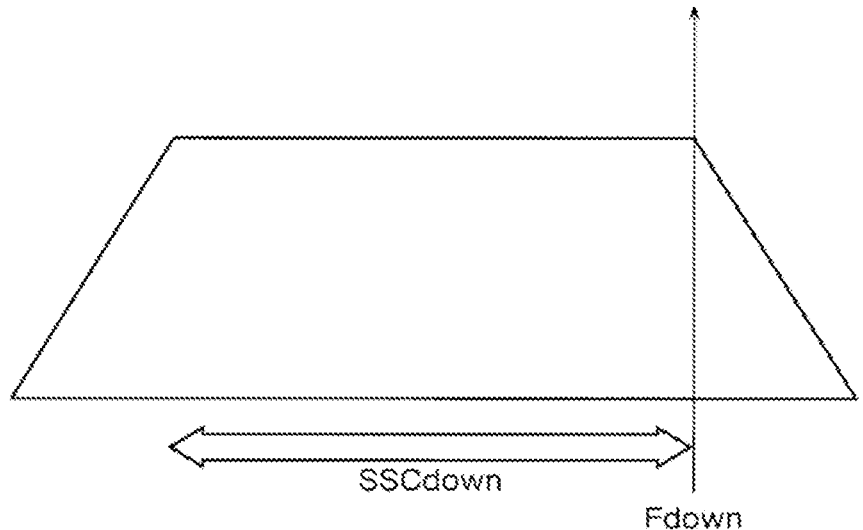
FIGS. 6A and 6B are diagrams illustrating a case in which a spread spectrum clock signal of a pseudo down-spread mode is generated from the center-spread mode.
Figure 6B:
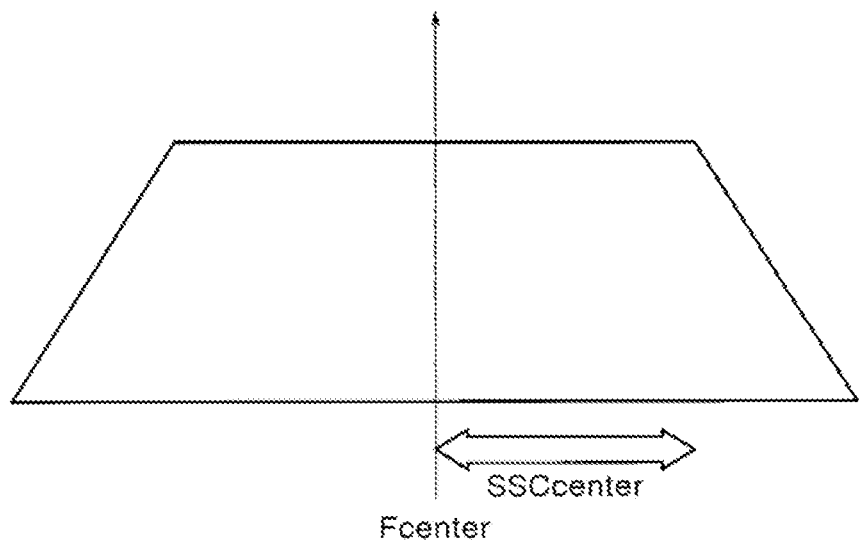

(4) A case in which the spread spectrum clock signal of the pseudo down-spread mode illustrated in FIG. 6A is generated from the center-spread mode illustrated in FIG. 6B (ST28)

In a case in which the carrier frequency and the modulation factor of the center-spread mode are Fcenter and SSCcenter, respectively, and the carrier frequency and the modulation factor of the down-spread mode are Fdown and SSCdown, respectively, it is possible to derive the following Expressions (7) and (8). However, the following Expressions (7) and (8) may be stored in the storage unit 14 in advance.

$$F\text{center}=F\text{down}\times(1-(SSC\text{down}/2)) \qquad \text{Expression (7)}$$

$$SSC\text{center}=SSC\text{down}/(2-SSC\text{down}) \qquad \text{Expression (8)}$$

The control unit 13 of the spread spectrum clock generator 2 performs a control process of shifting the carrier frequency of the modulation generation unit 11e such that the carrier frequency becomes the carrier frequency Fcenter obtained from the above-mentioned Expression (7) and performs a control process of correcting the modulation factor of the modulation generation unit 11e such that the modulation factor becomes the modulation factor SSCcenter obtained from Expression (8) (ST29). Therefore, the spread spectrum clock signal of the down-spread mode whose spectrum has been spread with an accurate modulation factor can be generated by the center-spread mode.

Figure 7A:
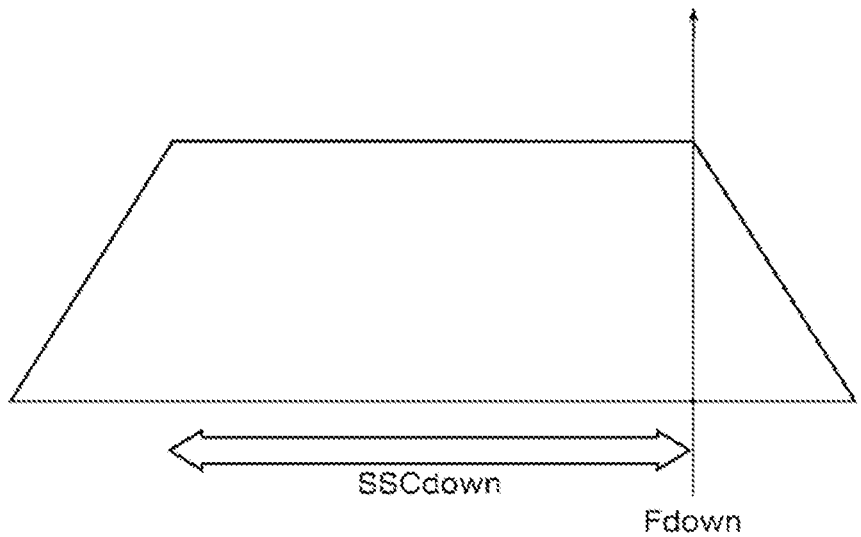
FIGS. 7A and 7B are diagrams illustrating a case in which the spread spectrum clock signal of the pseudo down-spread mode is generated from an upper-spread mode.
Figure 7B:
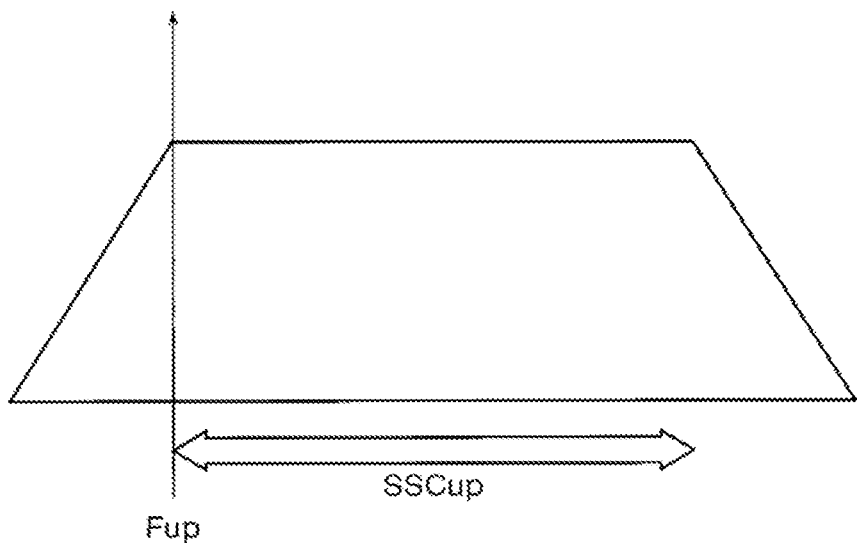

(5) A case in which the spread spectrum clock signal of the pseudo down-spread mode illustrated in FIG. 7A is generated from the upper-spread mode illustrated in FIG. 7B (ST30)

In a case in which the carrier frequency and the modulation factor of the upper-spread mode are Fup and SSCup, respectively, and the carrier frequency and the modulation factor of the down-spread mode are Fdown and SSCdown, respectively, it is possible to derive the following Expressions (9) and (10). However, the following Expressions (9) and (10) may be stored in the storage unit 14 in advance.

$$F\text{up}=F\text{down}\times(1-SSC\text{down}) \qquad \text{Expression (9)}$$

$$SSC\text{up}=SSC\text{down}/(1-SSC\text{down}). \qquad \text{Expression (10)}$$

The control unit 13 of the spread spectrum clock generator 2 performs a control process of shifting the carrier frequency of the modulation generation unit 11e such that the carrier frequency becomes the carrier frequency Fup obtained from the above-mentioned Expression (9) and performs a control process of correcting the modulation factor of the modulation generation unit 11e such that the modulation factor becomes the modulation factor SSCup obtained from Expression (10) (ST31). Therefore, the spread spectrum clock signal of the down-spread mode whose spectrum has been spread with an accurate modulation factor can be generated by the upper-spread mode.

Figure 8A:
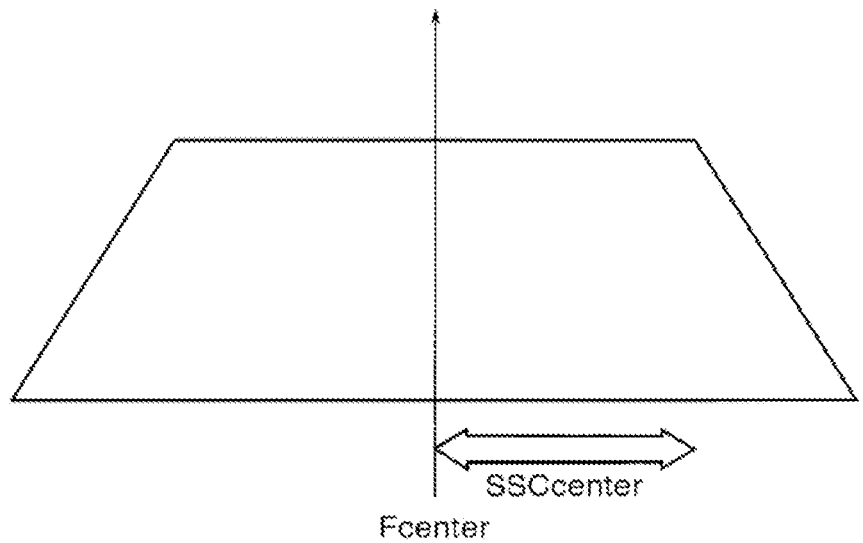
FIGS. 8A and 8B are diagrams illustrating a case in which the spread spectrum clock signal of the pseudo center-spread mode is generated from the upper-spread mode.
Figure 8B:
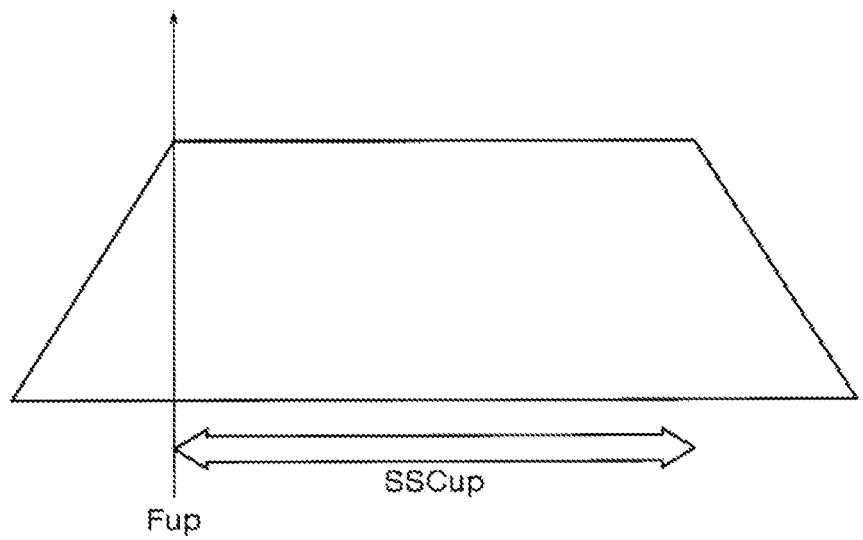

(6) A case in which the spread spectrum clock signal of the pseudo center-spread mode illustrated in FIG. 8A is generated from the upper-spread mode illustrated in FIG. 8B (ST32)

In a case in which the carrier frequency and the modulation factor of the upper-spread mode are Fup and SSCup, respectively, and the carrier frequency and the modulation factor of the center-spread mode are Fcenter and SSCcenter, respectively, it is possible to derive the following Expressions (11) and (12). However, the following Expressions (11) and (12) may be stored in the storage unit 14 in advance.

$$F\text{up}=F\text{center}\times(1-SSC\text{center}) \qquad \text{Expression (11)}$$

$$SSC\text{up}=2\times SSC\text{center}/(1-SSC\text{center}) \qquad \text{Expression (12)}$$

The control unit 13 of the spread spectrum clock generator 2 performs a control process of shifting the carrier frequency of the modulation generation unit 11e such that the carrier frequency becomes the carrier frequency Fup obtained from the above-mentioned Expression (11) and performs a control process of correcting the modulation factor of the modulation generation unit 11e such that the modulation factor becomes the modulation factor SSCup obtained from Expression (12) (ST33). Therefore, the spread spectrum clock signal of the center-spread mode whose spectrum has been spread with an accurate modulation factor can be generated by the upper-spread mode.

Then, the pattern generator 1 generates a pattern signal with a desired repetitive pattern on the basis of the spread spectrum clock signal (the frequency-multiplied spread spectrum clock signal) output from the phase locked loop unit 11 by the above-mentioned correction control process and the data of a low-level voltage of "0" and a high-level voltage of "1" (ST34).

EXAMPLES

Hereinafter, an example of a case in which the control unit 13 of the spread spectrum clock generator 2 performs the control process of shifting the carrier frequency of the modulation generation unit 11e in the phase locked loop unit and the control process of correcting the modulation factor, on the basis of the above-mentioned calculation expressions, will be described. Here, an example of (1) the case in which the spread mode is generated from the down-spread mode to the center-spread mode and a spread spectrum clock signal is generated will be described.

In a case in which the user selects the center-spread mode and sets necessary setting information including a carrier frequency Fcenter of 100 MHz and a modulation factor SSCcenter of 0.006 (0.6%) through the setting unit 12, the control unit 13 calculates the carrier frequency Fdown (=100×(1-0.006)=100.6 MHz) of the down-spread mode, using Expression (1), and performs a control process of shifting the carrier frequency of the modulation generation unit 11e such that the carrier frequency becomes the calculated carrier frequency Fdown (=100.6 MHz).

In addition, the control unit 13 calculates the modulation factor SSCdown (=2×SSCcenter/(1+SSCcenter)=(2×0.006)/(1+0.006)=0.012/1.006=0.011928 (1.1928%)) of the down-spread mode, using Expression (2), and performs a control process of correcting the modulation factor of the modulation generation unit 11e such that the modulation factor becomes the calculated modulation factor SSCdown (=0.012). Therefore, in a case in which the user selects a spread mode (a spread mode different from the spread mode before generation) and sets necessary setting information including the carrier frequency and the modulation factor, without being aware of the spread mode before generation, a control process of shifting the carrier frequency of the spread mode before generation and a process of correcting the modulation factor can be performed to generate the spread spectrum clock signal of the spread mode that is desired by the user.

As such, according to this embodiment, the spread spectrum clock signal can be generated by the upper-spread mode that is particularly required for the spread spectrum clock generator or the pattern generator. The spread spectrum clock signal can be generated by all of the upper-spread mode, the down-spread mode, and the center-spread mode. In particular, in a case in which it is difficult to generate the spread spectrum clock signal due to the limitations of a device, the carrier frequency is shifted to a frequency that is lower than the carrier frequency of the spread mode (the down-spread mode or the center-spread mode) before generation. Therefore, it is possible to perform the generation of the spread spectrum clock signal by the upper-spread mode, which has been difficult to achieve in a commercial one-chip PLLIC according to the related art.

In addition, according to this embodiment in which the control process of shifting the carrier frequency and the control process of correcting the modulation factor are performed using the calculation expressions for each predetermined spread mode, it is possible to solve the problems occurring in a case in which the amount of change in the carrier frequency before and after the spread mode is changed is large including, in addition to a case in which the carrier frequency is shifted to a frequency that is higher than the carrier frequency of the spread mode before generation. Therefore, it is possible to generate a spread spectrum clock signal with high accuracy in the desired spread mode.

Furthermore, in a case in which the spread mode of the spread spectrum clock generator corresponds to, for example, only the center-spread mode, when setting information which is required to generate the spread spectrum clock signal and includes the selection of the spread mode (the down-spread mode, the center-spread mode, and the upper-spread mode), the carrier frequency, and the modulation factor is set, the control process of shifting the carrier frequency and the control process of correcting the modulation factor can be performed on the basis of the calculation expressions for each predetermined spread mode to generate the spread spectrum clock signal of the down-spread mode or the upper-spread mode which does not correspond to the spread mode of the spread spectrum clock generator. This holds for the spread spectrum clock generator that corresponds to only other spread modes (the down-spread mode and the upper-spread mode).

In addition, according to this embodiment, the pattern generator 1 can generate the pattern signal with a desired repetitive pattern which has been modulated with the spread spectrum clock signal generated by the spread spectrum clock generator 2 in any one of the down-spread mode, the center-spread mode, and the upper-spread mode. Then, for example, the generated pattern signal can be input to the object to be measured as a test signal in a case in which an error measurement device performs a margin test for the object to be measured.

The preferred embodiments of the spread spectrum clock generator, the spread spectrum clock generation method, the pattern generator, and the pattern generation method according to the invention have been described above. The invention is not limited by the description of the preferred embodiments and the drawings. That is, for example, all of other embodiments, examples, and operation techniques that can be made by those stilled in the art on the basis of the above-described embodiments are included in the scope and spirit of the invention.

DESCRIPTION OF REFERENCE NUMERALS AND SIGNS

1: Pattern generator
2: Spread spectrum clock generator
3: Frequency multiplying unit
4: Pattern generation unit
11: Phase locked loop unit
11a: Frequency divider
11b: Phase comparator
11c: Charge pump
11d: Loop filter
11e: Modulation generation unit
11f: Adder
11g: Voltage-controlled oscillator
12: Setting unit
13: Control unit
14: Storage unit

What is claimed is:

1. A spread spectrum clock generator that spreads a spectrum of a signal with a predetermined carrier frequency to generate a spread spectrum clock (SSC) signal under the control of a control unit in order to generate a spread spectrum clock defined by a communication standard in a desired spread mode,
wherein:
the control unit includes carrier frequency correction control means,
the carrier frequency correction control means shifts the predetermined carrier frequency to generate, from one spread mode, a spread spectrum clock signal of another pseudo spread mode,
the desired spread mode is any one of a down-spread mode, a center-spread mode, and an upper-spread mode,
the carrier frequency correction control means performs at least one of a first control process of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control process of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode,
the control unit includes modulation factor correction control means, and
in a case in which the spread spectrum clock signal of the pseudo center-spread mode is generated from the down-spread mode, when a carrier frequency and a modulation factor of the pseudo center-spread mode are Fcenter and SSCcenter, respectively, and a carrier frequency and a modulation factor of the down-spread mode are Fdown and SSCdown, respectively, the modulation factor correction control means shifts the carrier frequency of the down-spread mode, using a calculation expression Fdown=Fcenter×(1+SSCcenter), and corrects the modulation factor of the down-spread mode, using a calculation expression SSCdown=2×SSCcenter/(1+SSCcenter).

2. A spread spectrum clock generator that spreads a spectrum of a signal with a predetermined carrier frequency to generate a spread spectrum clock (SSC) signal under the control of a control unit in order to generate a spread spectrum clock defined by a communication standard in a desired spread mode,
wherein:
the control unit includes carrier frequency correction control means,
the carrier frequency correction control means shifts the predetermined carrier frequency to generate, from one spread mode, a spread spectrum clock signal of another pseudo spread mode,
the desired spread mode is any one of a down-spread mode, a center-spread mode, and an upper-spread mode,
the carrier frequency correction control means performs at least one of a first control process of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control process of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode,
the control unit includes modulation factor correction control means, and
in a case in which the spread spectrum clock signal of the pseudo upper-spread mode is generated from the down-spread mode, when a carrier frequency and a modulation factor of the pseudo upper-spread mode are Fup and SSCup, respectively, and a carrier frequency and a modulation factor of the down-spread mode are Fdown and SSCdown, respectively, the modulation factor correction control means shifts the carrier frequency of the down-spread mode, using a calculation expression Fdown=Fup×(1+SSCup), and corrects the modulation factor of the down-spread mode, using a calculation expression SSCdown=SSCup/(1+SSCup).

3. A spread spectrum clock generator that spreads a spectrum of a signal with a predetermined carrier frequency to generate a spread spectrum clock (SSC) signal under the control of a control unit in order to generate a spread spectrum clock defined by a communication standard in a desired spread mode,
wherein:
the control unit includes carrier frequency correction control means,
the carrier frequency correction control means shifts the predetermined carrier frequency to generate, from one spread mode, a spread spectrum clock signal of another pseudo spread mode,
the desired spread mode is any one of a down-spread mode, a center-spread mode, and an upper-spread mode,
the carrier frequency correction control means performs at least one of a first control process of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control process of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode,
the control unit includes modulation factor correction control means, and
in a case in which the spread spectrum clock signal of the pseudo upper-spread mode is generated from the center-spread mode, when a carrier frequency and a modulation factor of the pseudo upper-spread mode are Fup and SSCup, respectively, and a carrier frequency and a modulation factor of the center-spread mode are Fcenter and SSCcenter, respectively, the modulation factor correction control means shifts the carrier frequency of the center-spread mode, using a calculation expression Fcenter=Fup×(1+(SSCup/2)), and corrects the modulation factor of the center-spread mode, using a calculation expression SSCcenter=SSCup/(2+SSCup).

4. A spread spectrum clock generator that spreads a spectrum of a signal with a predetermined carrier frequency to generate a spread spectrum clock (SSC) signal under the control of a control unit in order to generate a spread spectrum clock defined by a communication standard in a desired spread mode,
wherein:
the control unit includes carrier frequency correction control means,
the carrier frequency correction control means shifts the predetermined carrier frequency to generate, from one spread mode, a spread spectrum clock signal of another pseudo spread mode,
the desired spread mode is any one of a down-spread mode, a center-spread mode, and an upper-spread mode,
the carrier frequency correction control means performs at least one of a first control process of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control process of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode,
the control unit includes modulation factor correction control means, and
in a case in which the spread spectrum clock signal of the pseudo down-spread mode is generated from the center-spread mode, when a carrier frequency and a modulation factor of the pseudo down-spread mode are Fdown and SSCdown, respectively, and a carrier frequency and a modulation factor of the center-spread mode are Fcenter and SSCcenter, respectively, the modulation factor correction control means shifts the carrier frequency of the center-spread mode, using a calculation expression Fcenter=Fdown×(1−(SSCdown/2)), and corrects the modulation factor of the center-spread mode, using a calculation expression SSCcenter=SSCdown/(2−SSCdown).

5. A spread spectrum clock generator that spreads a spectrum of a signal with a predetermined carrier frequency to generate a spread spectrum clock (SSC) signal under the control of a control unit in order to generate a spread spectrum clock defined by a communication standard in a desired spread mode,
wherein:
the control unit includes carrier frequency correction control means,
the carrier frequency correction control means shifts the predetermined carrier frequency to generate, from one spread mode, a spread spectrum clock signal of another pseudo spread mode,
the desired spread mode is any one of a down-spread mode, a center-spread mode, and an upper-spread mode,
the carrier frequency correction control means performs at least one of a first control process of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control process of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode,
the control unit includes modulation factor correction control means, and
in a case in which the spread spectrum clock signal of the pseudo down-spread mode is generated from the upper-spread mode, when a carrier frequency and a modulation factor of the pseudo down-spread mode are Fdown and SSCdown, respectively, and a carrier frequency and a modulation factor of the upper-spread mode are Fup and SSCup, respectively, the modulation factor correction control means shifts the carrier frequency of the upper-spread mode, using a calculation expression Fup=Fdown×(1−SSCdown), and corrects the modulation factor of the upper-spread mode, using a calculation expression SSCup=SSCdown/(1−SSCdown).

6. A spread spectrum clock generator that spreads a spectrum of a signal with a predetermined carrier frequency to generate a spread spectrum clock (SSC) signal under the control of a control unit in order to generate a spread spectrum clock defined by a communication standard in a desired spread mode,
wherein:
the control unit includes carrier frequency correction control means,
the carrier frequency correction control means shifts the predetermined carrier frequency to generate, from one spread mode, a spread spectrum clock signal of another pseudo spread mode,
the desired spread mode is any one of a down-spread mode, a center-spread mode, and an upper-spread mode,
the carrier frequency correction control means performs at least one of a first control process of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control process of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode, the control unit includes modulation factor correction control means, and in a case in which the spread spectrum clock signal of the pseudo center-spread mode is generated from the upper-spread mode, when a carrier frequency and a modulation factor of the pseudo center-spread mode are Fcenter and SSCcenter, respectively, and a carrier frequency and a modulation factor of the upper-spread mode are Fup and SSCup, respectively, the modulation factor correction control means shifts the carrier frequency of the upper-spread mode, using a calculation expression Fup=Fcenter×(1−(SSCcenter), and corrects the modulation factor of the upper-spread mode, using a calculation expression SSCup=2×SSCcenter/(1−SSCcenter).

7. A spread spectrum clock generation method that spreads a spectrum of a signal with a predetermined carrier frequency to generate a spread spectrum clock (SSC) signal in order to generate a spread spectrum clock defined by a communication standard in a desired spread mode, the method comprising:

shifting the predetermined carrier frequency to generate, from one spread mode, a spread spectrum clock signal of another pseudo spread mode, wherein the desired spread mode is any one of a down-spread mode, a center-spread mode, and an upper-spread mode, at least one of a first control step of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control step of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode, and in a case in which the spread spectrum clock signal of the pseudo center-spread mode is generated from the down-spread mode, when a carrier frequency and a modulation factor of the pseudo center-spread mode are Fcenter and SSCcenter, respectively, and a carrier frequency and a modulation factor of the down-spread mode are Fdown and SSCdown, respectively, a step of shifting the carrier frequency of the down-spread mode, using a calculation expression Fdown=Fcenter×(1+SSCcenter), and correcting the modulation factor of the down-spread mode, using a calculation expression SSCdown=2×SSCcenter/(1+SSCcenter).

8. A spread spectrum clock generation method that spreads a spectrum of a signal with a predetermined carrier frequency to generate a spread spectrum clock (SSC) signal in order to generate a spread spectrum clock defined by a communication standard in a desired spread mode, the method comprising:

shifting the predetermined carrier frequency to generate, from one spread mode, a spread spectrum clock signal of another pseudo spread mode, wherein the desired spread mode is any one of a down-spread mode, a center-spread mode, and an upper-spread mode, at least one of a first control step of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control step of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode, and in a case in which the spread spectrum clock signal of the pseudo upper-spread mode is generated from the down-spread mode, when a carrier frequency and a modulation factor of the pseudo upper-spread mode are Fup and SSCup, respectively, and a carrier frequency and a modulation factor of the down-spread mode are Fdown and SSCdown, respectively, a step of shifting the carrier frequency of the down-spread mode, using a calculation expression Fdown=Fup×(1+SSCup), and correcting the modulation factor of the down-spread mode, using a calculation expression SSCdown=SSCup/(1+SSCup).

9. A spread spectrum clock generation method that spreads a spectrum of a signal with a predetermined carrier frequency to generate a spread spectrum clock (SSC) signal in order to generate a spread spectrum clock defined by a communication standard in a desired spread mode, the method comprising:

shifting the predetermined carrier frequency to generate, from one spread mode, a spread spectrum clock signal of another pseudo spread mode, wherein the desired spread mode is any one of a down-spread mode, a center-spread mode, and an upper-spread mode, at least one of a first control step of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control step of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode, and in a case in which the spread spectrum clock signal of the pseudo upper-spread mode is generated from the center-spread mode, when a carrier frequency and a modulation factor of the pseudo upper-spread mode are Fup and SSCup, respectively, and a carrier frequency and a modulation factor of the center-spread mode are Fcenter and SSCcenter, respectively, a step of shifting the carrier frequency of the center-spread mode, using a calculation expression Fcenter=Fup×(1+(SSCup/2)), and correcting the modulation factor of the center-spread mode, using a calculation expression SSCcenter=SSCup/(2+SSCup).

10. A spread spectrum clock generation method that spreads a spectrum of a signal with a predetermined carrier frequency to generate a spread spectrum clock (SSC) signal in order to generate a spread spectrum clock defined by a communication standard in a desired spread mode, the method comprising:

shifting the predetermined carrier frequency to generate, from one spread mode, a spread spectrum clock signal of another pseudo spread mode, wherein the desired spread mode is any one of a down-spread mode, a center-spread mode, and an upper-spread mode, at least one of a first control step of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control step of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode, and in a case in which the spread spectrum clock signal of the pseudo down-spread mode is generated from the center-spread mode, when a carrier frequency and a modulation factor of the pseudo down-spread mode are Fdown and SSCdown, respectively, and a carrier frequency and a modulation factor of the center-spread mode are Fcenter and SSCcenter, respectively, a step of shifting the carrier frequency of the center-spread mode, using a calculation expression Fcenter=Fdown×(1−(SSCdown/2)), and correcting the modulation factor of the center-spread mode, using a calculation expression SSCcenter=SSCdown/(2−SSCdown).

11. A spread spectrum clock generation method that spreads a spectrum of a signal with a predetermined carrier frequency to generate a spread spectrum clock (SSC) signal in order to generate a spread spectrum clock defined by a communication standard in a desired spread mode, the method comprising:

shifting the predetermined carrier frequency to generate, from one spread mode, a spread spectrum clock signal of another pseudo spread mode, wherein the desired spread mode is any one of a down-spread mode, a center-spread mode, and an upper-spread mode, at least one of a first control step of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control step of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode, and in a case in which the spread spectrum clock signal of the pseudo down-spread mode is generated from the upper-spread mode, when a carrier frequency and a modulation factor of the pseudo down-spread mode are Fdown and SSCdown, respectively, and a carrier frequency and a modulation factor of the upper-spread mode are Fup and SSCup, respectively, a step of shifting the carrier frequency of the upper-spread mode, using a calculation expression Fup=Fdown×(1−SSCdown), and correcting the modulation factor of the upper-spread mode, using a calculation expression SSCup=SSCdown/(1−SSCdown).

12. A spread spectrum clock generation method that spreads a spectrum of a signal with a predetermined carrier frequency to generate a spread spectrum clock (SSC) signal in order to generate a spread spectrum clock defined by a communication standard in a desired spread mode, the method comprising:

shifting the predetermined carrier frequency to generate, from one spread mode, a spread spectrum clock signal of another pseudo spread mode, wherein the desired spread mode is any one of a down-spread mode, a center-spread mode, and an upper-spread mode, at least one of a first control step of shifting the carrier frequency to a frequency that is lower than the predetermined carrier frequency in a case in which the spread spectrum clock signal of a pseudo center-spread mode is generated from the down-spread mode, the spread spectrum clock signal of a pseudo upper-spread mode is generated from the down-spread mode, or the spread spectrum clock signal of the pseudo upper-spread mode is generated from the center-spread mode and a second control step of shifting the carrier frequency to a frequency that is higher than the predetermined carrier frequency in a case in which the spread spectrum clock signal of a pseudo down-spread mode is generated from the center-spread mode, the spread spectrum clock signal of the pseudo down-spread mode is generated from the upper-spread mode, or the spread spectrum clock signal of the pseudo center-spread mode is generated from the upper-spread mode, and in a case in which the spread spectrum clock signal of the pseudo center-spread mode is generated from the upper-spread mode, when a carrier frequency and a modulation factor of the pseudo center-spread mode are Fcenter and SSCcenter, respectively, and a carrier frequency and a modulation factor of the upper-spread mode are Fup and SSCup, respectively, a step of shifting the carrier frequency of the upper-spread mode, using a calculation expression Fup=Fcenter×(1−(SSCcenter), and correcting the modulation factor of the upper-spread mode, using a calculation expression SSCup=2× SSCcenter/(1−SSCcenter).

* * * * *